United States Patent [19]

Jansson

[11] Patent Number: 4,988,899
[45] Date of Patent: Jan. 29, 1991

[54] TTL GATE CURRENT SOURCE CONTROLLED OVERDRIVE AND CLAMP CIRCUIT

[75] Inventor: Lars G. Jansson, Long Island, Me.

[73] Assignee: National Semiconductor Corporation, Santa Clara, Calif.

[21] Appl. No.: 450,826

[22] Filed: Dec. 11, 1989

Related U.S. Application Data

[63] Continuation-in-part of Ser. No. 352,169, May 15, 1989.

[51] Int. Cl.$^5$ ............... H03K 19/092; H03K 19/003
[52] U.S. Cl. .................................... 307/475; 307/456; 307/443; 307/300; 307/262
[58] Field of Search ............... 307/475, 456, 443, 300, 307/262

[56] References Cited

U.S. PATENT DOCUMENTS

| | | | |
|---|---|---|---|
| 4,415,817 | 11/1983 | Fletcher | 307/300 |
| 4,644,194 | 2/1987 | Birrittella et al. | 307/475 |
| 4,678,944 | 7/1987 | Williams | 307/475 |
| 4,684,831 | 8/1987 | Kruest | 307/475 |
| 4,851,715 | 7/1989 | Strong | 307/456 |

Primary Examiner—Stanley D. Miller
Assistant Examiner—Andrew Sanders
Attorney, Agent, or Firm—Lee Patch; Daniel H. Kane

[57] ABSTRACT

An ECL/CML to TTL translator circuit couples the output of an ECL/CML gate to the input of a TTL gate. The ECL/CML gate operates with reference to a first power rail higher reference voltage level with transistor elements operating in the non-saturation operating region. The TTL gate operates with reference to a second power rail lower reference voltage level with transistor elements operating in the saturation threshold operating region. The translator circuit includes a reference voltage level shifting constant current non-switching current mirror circuit coupled to the output of the ECL/CML gate for shifting the reference voltage level of the ECL/CML gate output from the higher reference voltage level to the lower reference voltage level. An operating region translating emitter follower output buffer circuit is coupled to receive the voltage level shifted output signal and drive the input of the TTL gate. The circuit functions of reference voltage level shifting and of operating region translating are thereby separated. Base drive to the phase splitter transistor element is limited by a base drive limiting anti-saturation clamp circuit. More generally, an overdrive and anti-saturation clamp control circuit provides high speed switching of a phase splitter transistor element, pulldown transistor element, or other TTL switching transistor element for generalized application in TTL internal and output gates and buffers. The overdrive and clamp control circuit provides a "programmable" base-collector clamp voltage for operation of TTL switching transistor elements in "soft" saturation, in threshold saturation, or entirely out of saturation for operation of linear TTL circuits.

22 Claims, 6 Drawing Sheets

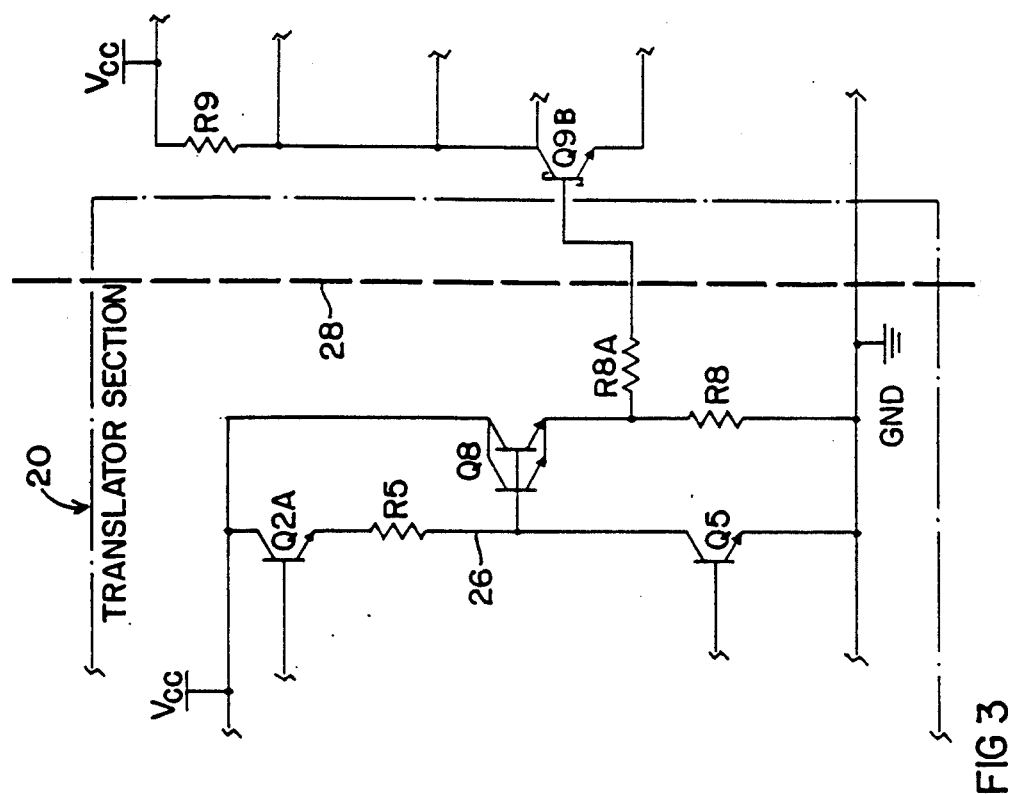
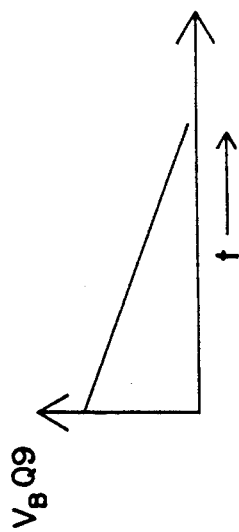
FIG 1A (PRIOR ART)
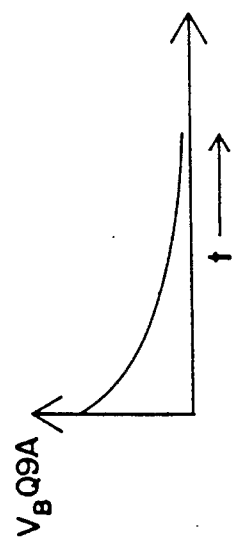
FIG 2A
FIG 3

TTL GATE CURRENT SOURCE CONTROLLED OVERDRIVE AND CLAMP CIRCUIT

CROSS REFERENCE TO RELATED PATENT APPLICATION

This patent application is a continuation-in-part (CIP) of U.S. patent application Ser. No. 352,169 filed May 15, 1989 for HIGH SPEED ECL/CML TO TTL TRANSLATOR CIRCUIT by the same applicant.

TECHNICAL FIELD

This invention relates to a new ECL/CML to TTL translator circuit for coupling the output of an emitter coupled logic (ECL) or current mode logic,(CML) gate to the input of a transistor transistor logic (TTL) gate. The translator circuit shifts the signal reference voltage level from the ECL or CML reference voltage to the TTL reference voltage, and translates the operating region of the respective transistor elements from the ECL or CML non-saturation operating region to the TTL soft saturation or threshold saturation operating region. The invention is particularly applicable to integrated circuits in which the ECL/CML gates and TTL gates are coupled between the same power rails, such as $V_{CC}$ and ground potential power rails. More generally, the invention provides a new current source controlled overdrive and clamp circuit for high speed switching of TTL gate transistor elements such as TTL phase splitter transistor elements, TTL pulldown transistor elements, or other TTL switching transistor elements. The TTL gate overdrive and clamp control circuit provides a "programmable" base-collector (B-C) clamp voltage for operation of TTL switching transistor elements, for example, in "soft" saturation replacing the internal Schottky diode of Schottky clamped transistor elements. This external clamp voltage is also "programmable" or variable for operation of the TTL switching transistor elements in threshold saturation or entirely out of saturation for a new class of non-saturation linear TTL circuits. For applications in both internal gates and output buffers, the control circuit dramatically reduces turn-off time for any transistor that is clamped for operation effectively out of the saturation operating region, decreases signal propagation times for tpLH and tpHL during switching transitions, and reduces skew between tpLH and tpHL for inverting buffers. For applications in TTL output circuits, the high speed switching overdrive and clamp circuit also provides graduated turn on of the TTL switching transistor element for inhibiting ground bounce, and a counteracting current for cancelling ground undershoot.

BACKGROUND ART

A conventional ECL/CML to TTL translator circuit 10, coupled between an ECL/CML gate 12 and a TTL gate 14 is illustrated in FIG. 1. The ECL gate 12 provides the input to the translator section 10 and the ECL gate voltage levels are referenced to the higher reference voltage level positive power rail $V_{CC}$(ECL). The translator section 10 in turn provides the input to drive the TTL gate 14. The TTL gate voltage levels are referenced to the lower reference voltage level ground power rail GND (TTL). The ECL gate 12 includes ECL input transistors Q1 and Q2 with emitter nodes tied together to the ECL tail current source transistor element Q3 and tail resistor R3. Current source transistor element Q3 is provided with base drive current by tail current source voltage $V_{CC}$ and sources tail current through tail resistor R3 to a low voltage level $V_{EE}$ which in this example may be ground potential GND. The ECL input transistors Q1 and Q2 provide alternative collector lead resistor current paths through swing resistors R1 and R2. Complementary high and low logic base current levels at the complementary inputs $I_{TN}(1)$ and $I_{TN}(0)$ at the respective base nodes of the input transistors Q1 and Q2 determine which transistor is conducting for conducting tail current generated by current source transistor element Q3 through the respective swing resistor.

The complementary outputs of ECL gate 12 are taken from the respective collector nodes of ECL input transistors Q1 and Q2. The voltage swing between the logic high and low level output signals is established by the magnitude of the tail current generated by current source transistor element Q3 and tail resistor R3, and by the swing resistors R1 and R2 which are generally of equal value. The complementary output signals are delivered through emitter follower output buffer transistor elements Q1A and Q2A respectively.

In the conventional translator circuit 10 of FIG. 1, the emitter follower output transistor elements Q1A and Q2A are coupled in respective branch circuits 15,16 of a current mirror circuit. The current mirror circuit is established by current mirror transistor elements Q4 and Q5 coupled in current mirror configuration with respective collector lead resistors R4 and R5. Transistor element Q4 is a base collector shorted (BCS) transistor. Resistors R4 and R5 are of equal value and resistor R4 establishes the current level in the branch circuit 15 which is mirrored in branch circuit 16.

The current flowing in branch circuit 15 is established by resistor R4 and the voltage drop across resistor R4 which is dependent upon $V_{CC}$. Analysis reveals that resistor R5 in branch circuit 16 shifts the reference voltage level of the output signal on line 16 from $V_{CC}$ to ground potential at the collector node of the second current mirror transistor Q5. This is because the $V_{CC}$ dependency of the voltage drop across resistor R5 is cancelled by the $V_{CC}$ dependency of the current mirrored in branch circuit 16 from branch circuit 15. With the $V_{CC}$ dependencies offsetting and cancelling each other in branch circuit 16, the voltage level at the collector node of current mirror transistor Q5 is set with reference to the TTL ground potential level GND (TTL).

The reference voltage level shifted output signal from the collector node of current mirror transistor Q5 is coupled directly to the base node of inverting stage transistor Q6 which in turn controls the phase splitter transistor element Q9 of the TTL gate 14. While the current mirror transistor element Q5 in current mirror branch circuit 16 operates in the linear or non-saturation operating region characteristic of the emitter coupled logic, the inverting stage transistor element Q6 operates in the non-linear saturation operating region characteristic of the TTL gate transistor elements. The reference voltage level shifted output signal directly drives the first stage transistor element associated with the TTL gate and operating in the non-linear saturation region. The dividing line between components operating in the linear non-saturation operating region characteristic of the emitter coupled logic, and the components operating in the non-linear saturation operating region characteristic of the transistor transistor logic is indicated by dash line 18.

The first stage saturation region transistor element Q6 is coupled to the base of phase splitter transistor element Q9 of the TTL gate 14 through diode D1. This TTL input circuit includes Q6 collector lead resistor R6 and Q9 base resistor R16 coupled to $V_{CC}$. The collector node of inverting stage saturation region transistor element Q6 is coupled through the boot strap circuit provided by boot strap transistor element Q7 and resistor R7 to the base node of transistor element Q6 and to the reference voltage level shifted collector node of current mirror transistor element Q5. The boot strap current applied through resistor R7 after the base of first stage TTL transistor element Q6 is discharged, assures that current mirror transistor element Q5 remains out of the saturation operating region and in the linear operating region.

A disadvantage of the conventional translator circuit 10 of FIG. 1 is that the current mirror circuit is a switching current mirror circuit. The current mirror transistor elements Q4 and Q5 switch between two different emitter current densities in response to switching between high and low logic levels at the collector node of ECL input transistor Q1 and switching of the emitter current from emitter follower buffer transistor element Q1A. The switching of emitter current densities by current mirror transistor Q4 is mirrored by current mirror transistor Q5. The current mirror current source transistor elements Q4 and Q5 can respond only slowly with delayed switching of the voltage level at the collector node of current mirror transistor element Q5 according to the high or low switching level at the input of ECL input transistor Q1. Because of the slow switching response of current source transistors Q4 and Q5, inherent propagation delays are introduced in the translator section 10.

Furthermore, discharge of the base of the first saturation stage transistor element Q6 takes place directly through the current mirror transistor element Q5. The switching from high to low voltage level at the collector node of current mirror transistor element Q5, and discharge of the base of transistor element Q6 operating in the saturation region, follows a delayed linear ramp function as shown for example in FIG. 1A. Overall, the same level switching node of transistor element Q5 where the reference voltage level shift occurs also drives the base of the first stage transistor element Q6 operating in the TTL saturation operating region. The result is delayed propagation during high to low switching transitions and in particular slow down in the signal propagation time tpHL during transition from high to low potential at the ECL gate input and TTL gate output.

The TTL gate 14 is provided by the conventional components including the Darlington pair of pullup transistor elements Q11 and Q12 for sourcing current from the high potential power supply rail $V_{CC}$(TTL) to the output $V_{OUT}$ (TTL). Pulldown transistor element Q13 sinks current from the output $V_{OUT}$(TTL) to the lower ground potential rail GND (TTL). Resistor R12 and diode D12 provide resistive pulldown discharge for the base of pulldown transistor element Q13. An "A.C. Miller killer" of the type described in U.S. Pat. No. 4,321,490, for active discharge of capacitive feedback Miller current at the base of pulldown transistor element Q13 is provided by active discharge transistor Q14 and associated diode network D9, D10, and D11. Accelerated switching of the output from high to low potential is provided by feedback transistor Q10 with feedback transistor base drive through resistor R10 and diode D6. Speed up diode D5 accelerates turnoff at the base of Darlington transistor Q12 during transition from high to low potential at the output $V_{OUT}$(TTL). Additional bias components associated with the Darlington pullup transistor elements Q11 and Q12 include resistor R11, diode D7 and diode D8.

An historic disadvantage of TTL circuits generally in comparison with ECL circuits is the operation of TTL gate transistor elements and switching transistor elements in the saturation operating region of the transistors. The saturation operating region is characterized by minority charge carrier storage in the base of the transistor element. For a P type material base in NPN transistors, electrons are the minority charge carriers. Discharge of the stored charge carriers from the base required for turn off of the TTL transistor element introduces switching delays and consequent signal propagation delay through the TTL circuit. In the TTL output buffer circuit of FIG. 1, dissipation of the charge carriers stored in saturation increases signal propagation time tpLH during transition from low to high potential at the output when the phase splitter transistor element Q9 and pulldown transistor element Q13 are turning off. Further background on TTL transistor elements and circuits follows.

Transistor-transistor logic (TTL) is widely used for bipolar transistor circuits such as the FAST ® Fairchild Advanced Schottky TTL circuits. This family of integrated circuit (IC) devices is described in a Databook published by National Semiconductor Corporation in 1988 entitled "FAST ® ADVANCED SCHOTTKY TTL LOGIC". The contents of this Databook are incorporated herein by reference. The FAST ® devices are fabricated using the well known Isoplanar II technology which produces integrated circuit transistors with well-controlled switching speed, extremely small parasitic capacitance, and high switching frequency $f_T$ in excess of 5 GHz. These small transistors operate with currents in the range of a few milliamperes. The TTL IC devices are useful in conventional logic configurations employed in small scale integration (SSI), medium scale integration (MSI), and in large scale integration (LSI). SSI circuits are designed to provide relatively large output currents or high "fan-out" capability for driving a large number of loads and for driving capacitive loads. In MSI and LSI circuits the elementary gate circuits may communicate only with other internal gates of the IC chip. It is not necessary to provide the high drive, high "fan-out" capability of the SSI construction for such internal gates. However, output gates that communicate with off chip elements ordinarily require the high drive, high "fan-out" capability.

TTL circuits conventionally use the so called "Schottky clamped" transistor construction to reduce the transistor turn off delays that are associated with minority carrier storage in saturation. In this device a Schottky barrier diode, simply referred to herein as a Schottky diode, is connected between the transistor collector and base. When the transistor turns on, the collector potential falls below the base potential by an amount equal to the voltage drop $V_{SD}$ across a Schottky diode. The Schottky diode then conducts and clamps the collector-to-base potential at the forward conduction potential across the Schottky diode. This bias level is substantially below the level at which the collector will inject or flood the base with significant minority carriers and is referred to as "soft saturation". Minority charge carrier storage is substantially avoided or minimized along with the excessive transistor turn off delay that is ordinarily associated with a saturated transistor. The Schottky diode clamped transistors can be made for fast switching with very low capacitances. However, Schottky clamped TTL transistor elements have a relatively high forward conducting voltage drop and require the extra fabrication step of diode formation.

Furthermore, while the Schottky diode will prevent deep saturation in a PN junction transistor at room temperature, the Schottky diode forward voltage drop does not track the same minority carrier injecting level or maintain the soft saturation level of the transistor at all temperatures. Increased minority carrier storage is observed with increased gate propagation delay for the low-to-high output logic transition at higher temperatures. Typically, such increased delays are evident above about 100° C.

OBJECTS OF THE INVENTION

It is therefore an object of the present invention to provide a new ECL/CML to TTL translator circuit utilizing a constant current non-switching current mirror circuit to accomplish the reference voltage level shifting and signal propagation from an ECL/CML gate to a TTL gate without the delays interposed by switching current mirror transistor elements.

Another object of the invention is to increase speed of signal propagation from an ECL/CML gate to a TTL gate by separating the functions of reference voltage level shifting and transistor element operating region translating. Reference voltage level shifting from the higher voltage level ECL rail to the lower voltage level TTL rail is to be accomplished by a constant current, non-switching, current mirror circuit. Translating from the linear non-saturation operating region of the ECL transistor elements to the nonlinear saturation operating region of the TTL transistor elements is to be accomplished by a separate emitter follower output buffer circuit.

A further object of the invention is to provide accelerated turn on and turn off of the TTL gate phase splitter transistor element and other TTL switching transistor elements which normally operate in the saturation region or the soft saturation operating region. This is accomplished in part by the separation of the functions of phase splitter control or TTL gate input control from reference voltage level shifting.

This is also accomplished by using a novel anti-saturation current source controlled overdrive and clamp circuit for TTL switching transistor elements. Accelerated turn on of the phase splitter transistor element is achieved using active current source base drive or "overdrive". Rapid turn off is achieved by clamping the operation of the phase splitter transistor element in soft or threshold saturation to prevent deep saturation or to prevent any saturation at all. The overdrive and clamp control circuit further increases switching speed and reduces noise by inhibiting ground bounce and cancelling ground undershoot during transition from high to low potential at the TTL output.

Further major objects of the invention are: to provide a TTL transistor saturation prevention circuit that is temperature compensated to prevent saturation over a desired temperature range; to provide a circuit that can avoid TTL transistor saturation without using an internal Schottky barrier diode; and to operate TTL gate transistors in an external control circuit that clamps the collector-base potential below the level that produces any significant minority carrier injection. Generally the invention provides the capability for a new class of TTL gate transistor elements and circuits operating in the linear region or outside of the deep saturation operating region.

DISCLOSURE OF THE INVENTION

In order to accomplish these results the invention provides an ECL/CML to TTL translator circuit for coupling the output of an ECL/CML gate to the input of a TTL gate. The ECL/CML gate operates with reference to a first power rail higher reference voltage level, with transistor elements operating in the non-saturation operating region. The TTL gate operates with reference to a second power rail lower reference voltage level, with transistor elements operating in the saturation operating region. According to the invention the circuit functions of reference voltage level shifting and of operating region translating are separated and performed by separate translator circuit portions.

A reference voltage level shifting constant current non-switching current mirror circuit is coupled to the output of the ECL/CML gate. The reference voltage level shifting circuit portion shifts the reference voltage level of the ECL/CML gate output and delivers a reference voltage level shifted output signal. A separate operating region translating emitter follower output buffer circuit is coupled to receive the voltage level shifted output signal. This operating region translating circuit portion drives the input of the TTL gate in the saturation operating region.

In the preferred example embodiment, the reference voltage level shifting constant current circuit includes a first current mirror branch circuit and first current mirror transistor element operatively coupled between the higher reference level and the lower reference voltage level for generating a constant reference current. There is no direct connection between the first current mirror branch circuit and the ECL/CML gate output thereby maintaining the constant reference current during switching of the ECL/CML gate.

The reference voltage level shifting constant current circuit also includes a second current mirror branch circuit and second current mirror transistor element operatively coupled between the ECL/CML gate output and the lower reference voltage level. The second current mirror transistor element is coupled in current mirror configuration with the first current mirror transistor element for mirroring the constant reference current in the second current mirror branch circuit coupled to the output of the ECL/CML gate. The current mirroring also maintains the constant reference current in the second current mirror branch circuit during switching of the ECL/CML gate.

A level shifting resistor element is incorporated in the second current mirror branch circuit for shifting the reference voltage level of the output signal from the ECL/CML gate output. The reference voltage level is shifted from the higher to the lower reference voltage level at the collector node of the second current mirror transistor element. This collector node provides the reference voltage level shifted output from the reference voltage level shifting circuit portion of the translator circuit of the invention.

A feature and advantage of the constant current circuit for reference voltage level shifting according to the invention is that there is no switching of the current mirror transistor elements. The current mirror transistor elements maintain constant emitter current densities thereby avoiding the switching delays introduced into the signal propagation through conventional translator circuits. Furthermore, the function of the current mirror transistor elements in the translator circuit is limited to reference voltage level shifting.

In the reference voltage level shifting circuit portion, the first constant current mirror branch circuit includes a standard reference resistor element having resistance value substantially equal to the reference voltage shifting resistor element in the second constant current mirror branch circuit. A standard reference voltage drop is established across the standard reference resistor element by a diode stack between the resistor element and the lower reference voltage level. A feature and advantage of this arrangement is that the diode stack may also be used to establish the tail current source voltage $V_{CS}$ for driving the tail current source transistor element of the ECL/CML gate. One of the elements of the diode stack may also be a BCS transistor element which also serves as the first current mirror transistor element.

The separate operating region translating circuit is provided by an emitter follower output buffer circuit operating in the non-saturation operating region. The emitter follower output buffer circuit is coupled to receive base drive from the reference voltage level shifted output and to drive the input of the TTL gate in the saturation operating region. The circuit function of operating region translating from the non-saturation operating region to the saturation operating region is thereby separated from the function of reference voltage level shifting and the respective functions are performed by separate circuit components of the translator circuit.

According to the invention the emitter follower output buffer circuit provides resistor pulldown between the TTL gate input and the lower reference voltage level for discharging the first stage transistor element of the TTL gate operating in the saturation region through the resistor pulldown element. In the preferred example embodiment the first TTL gate input stage is provided by the TTL gate phase splitter transistor element. The phase splitter transistor element is coupled to receive base drive directly from the emitter follower output buffer circuit. The resistor pulldown element is coupled between the base node of the phase splitter element and the lower reference voltage level.

A feature and advantage of this arrangement is that the resistor pulldown affords accelerated discharge from the base of the phase splitter transistor element and turn off of the phase splitter transistor element during switching from low to high logic potential level at the TTL gate output. The accelerated discharge by the resistor pulldown contrasts with the delayed ramp switching function of the current mirror current source pulldown provided in the conventional translator circuit. The conventional second current mirror transistor element must perform dual functions of reference voltage level shifting and control of the first stage TTL transistor element operating in the saturation operating region. These delays of the conventional translator circuit are avoided in the present invention.

Another feature and advantage is that the operating region translating circuit portion of the translator circuit of the invention provides active current source base drive and "overdrive" for the active switching TTL transistor element. As a result, the emitter follower output buffer circuit provides accelerated turn on of the phase splitter transistor element during transition from high to low potential at the TTL gate output. It is the emitter follower output buffer transistor element that initially provides the unlimited base drive or "overdrive" to the base of the phase splitter transistor element for accelerated turn on.

For subsequently limiting base drive to the phase splitter transistor element, the invention according to one alternative embodiment provides a base drive clamp circuit operatively coupled between the collector node of the phase splitter transistor element and the base node of the emitter follower output buffer circuit. When the phase splitter transistor element becomes conducting through the collector to emitter primary current path, the base drive clamp circuit begins conducting and clamps operation of the phase splitter transistor element in the soft saturation operating region or threshold saturation operating region. By preventing the phase splitter transistor element from operating in the deep saturation operating region, the phase splitter transistor element is poised for rapid turn off by resistor pulldown upon transition from low to high potential at the TTL gate output.

In an alternative base drive limiting circuit embodiment, a base drive limiting resistor element is coupled between the emitter node of the emitter follower output buffer transistor element and the base node of the phase splitter transistor element. The base drive limiting resistor element provides an alternative to the base drive limiting clamp circuit.

More generally, the invention provides an overdrive and clamp control circuit for high speed switching of a phase splitter transistor element, pulldown transistor element, or other TTL switching transistor element of a TTL gate. The current source controlled overdrive and clamp circuit includes the current mirror circuit or other voltage reference level shift circuit which provides a reference voltage current source. The reference voltage level current source provides potentially saturation region forward biasing drive or "overdrive" current for accelerated turn on of the TTL switching transistor element by means of the emitter follower transistor element. The emitter follower transistor element provides a buffer coupled to the reference voltage current source for actively driving the TTL switching transistor element. The increase in turn on speed is due to the active element emitter follower which provides added gain or extra gain for driving the base of the TTL switching transistor element in comparison with a passive resistive element base drive.

The overdrive and clamp control circuit also includes the base drive clamp circuit or base-collector (B-C) clamp circuit coupled between a collector node of the TTL switching transistor element and a base node of the emitter follower transistor element. The base drive clamp circuit is constructed and arranged for clamping the operation of the TTL switching transistor element in the soft saturation operating region, at the threshold of the saturation operating region, or out of the saturation operation region entirely for rapid turn-off of the TTL transistor.

As used herein in the specification and claims the phrases "deep saturation", "soft saturation operating region" or "soft saturation", "threshold saturation operating region" or "threshold saturation", and "out of saturation" or "nonsaturated operation" or "linear operation" for TTL switching transistor elements are generally intended as follows. "Deep saturation" refers to operation of the TTL switching transistor element with a forward bias or forward voltage drop $V_{BC}$ across the base to collector (B-C) junction of $V_{BC} > \phi$ where $\phi$ is the standard base to emitter (B-E) PN junction voltage drop $V_{BE}$. "Soft saturation" refers to operation with B-C forward bias in the range of approximately $\frac{1}{2}\phi < V_{BC} \leqq \phi$. $V_{BC}$ is closer to $\frac{1}{2}\phi$ for room temperature operation and closer to $\phi$ at high temperature for Schottky clamped TTL transistor elements, Operation with forward bias in the range of $0 < V_{BC} \leqq \frac{1}{2}\phi$ is referred to herein as "threshold saturation" operation, and effectively eliminates charge carrier storage and achieves switching speeds comparable to linear operation. For practical purposes the transistor element is out of saturation and linear in this threshold saturation operating region. In the strict sense, however, "linear operation", "out of saturation" refers to operation of the transistor element with 0 or negative $V_{BC}$.

In the preferred example embodiment the TTL switching transistor element is a phase splitter transistor element in a TTL output buffer circuit and/or a pulldown transistor element for sinking current from the output of the TTL output buffer circuit to low potential upon transition from high to low potential at the output. The phase splitter transistor element and the pulldown transistor element may be coupled in an external overdrive and B-C clamp control circuit.

According to the preferred example, the base drive clamp circuit is provided by a resistor element and a $V_{BE}$ diode junction coupled in series. A feature of this base drive clamp arrangement is that the paired resistor and diode junction provide temperature compensation for the base collector voltage over a desired range of temperatures. Furthermore, the B-C junction clamp voltage is "programmable" or variable to clamp operation of the TTL gate transistor element in "soft saturation", at "threshold saturation", or entirely "out of saturation". Alternatively the base drive clamp may be provided by a Schottky diode junction element and a $V_{BE}$ junction diode element coupled in series for an external Schottky clamp transistor element.

Upon transition from a low to high potential at the emitter follower and input base node of the phase splitter or other TTL transistor element (corresponding to a high to low transition at the output), the overdrive provides rapid turn on of the phase splitter transistor element. As the potential at the collector node falls, the base drive clamp begins conducting current into the collector node of the phase splitter transistor element when the forward bias across the base to collector junction of the phase splitter transistor element reaches the "programmed" operating region. The base drive clamp circuit therefore holds the operation of the phase splitter transistor element in "soft saturation", "threshold saturation", or out of saturation entirely according to the selected or programmed clamp voltage for rapid turn off upon a transition from high to low potential at the emitter follower input and base node of the phase splitter transistor element (corresponding to a low to high transition at the output).

More specifically, the invention provides a clamp control circuit that creates a feedback loop between the collector of the phase splitter or other TTL switching transistor element, and the base of the emitter follower transistor element. The emitter follower transistor element provides an active current source base drive to the base of the phase splitter or other switching transistor element. And, the feedback clamp control circuit controls the base drive current to the phase splitter, for example. When the collector potential of the phase splitter is falling relative to the base potential of the emitter follower transistor element and reaches a fixed "programmed" level with respect to that base potential, then base drive current is shunted, from the base node of the emitter follower transistor element to the collector node of the phase splitter transistor element through the clamp control circuit. In other words, the base drive current is diverted and "lost" to the collector node of the phase splitter transistor element if that collector node potential falls too low.

A feature and advantage of the base collector clamp circuit coupled between the collector node of the TTL phase splitter transistor element or other TTL switching transistor element of a TTL output buffer circuit and a base node of the emitter follower transistor element is that it inhibits ground bounce by providing phased turn on of the phase splitter transistor element or other switching TTL transistor element. Initially upon turn on of the phase splitter transistor element, the collector path current rises while the collector node potential falls. Initially the collector current level is provided by the collector path resistor element. However as the collector node potential falls to the saturation threshold operating region, the base drive clamp circuit operates and the clamp circuit also flows into the collector of the phase splitter transistor element. Typically, the base drive clamp circuit current is approximately one third the collector path resistor current and for a TTL switching transistor element turn on time of 3 ns, the clamp current cuts in at 1.5 ns. The resulting graduated turn on of current from the emitter of the TTL phase splitter or other switching transistor element therefore inhibits ground bounce by reducing the parasitic voltage drop across the ground lead inductance.

A further feature and advantage of the overdrive and clamp circuit for high speed switching of the phase splitter transistor element in TTL output gates is that ground undershoot at the output is suppressed. During transition from high to low potential at the TTL gate output, the emitter follower buffer transistor element driving the phase splitter transistor element, the phase splitter transistor element and the pulldown transistor element are all conducting. A current path is established between the reference voltage current source provided by the current mirror circuit and the output of the TTL gate through the internal Schottky diode clamp of the pulldown transistor element which is selected to be a Schottky transistor element. Upon occurrence of ground undershoot at the TTL gate output, that is a ground potential below external reference ground, a counteracting current is momentarily sourced from the reference voltage current source through the emitter follower transistor element, phase splitter transistor element, and Schottky diode clamp of the pulldown transistor element to the TTL gate output. The ground undershoot potential is therefore cancelled.

Thus, the overdrive circuit provides a counteracting current into the output exactly opposite to the parasitic ground undershoot inducing current. As soon as the potential at the output of the TTL gate passes below $V_{OL}$, the overdrive circuit and emitter follower transistor element pump the counteracting current into the output. The parasitic di/dt is "captured" by the counteracting −di/dt. As a result the parasitic ground undershoot potential Ldi/dt is cancelled by the counteracting potential −Ldi/dt. The emitter follower responds momentarily to the parasitic Ldi/dt across the output lead inductance as soon as it occurs.

The invention is also applied in a generalized TTL output gate with external overdrive and clamp control circuit applied to the phase splitter transistor element and/or pulldown transistor element; and in a generalized TTL internal, low drive or low fan-out invertor gate.

The generalized circuit of the invention comprises a TTL transistor stack with at least an input emitter follower transistor element and an output pulldown transistor element. A level shift current source such as a current mirror circuit is coupled to the base node of the emitter follower transistor element and establishes a first potential level at the base node with reference to ground potential. The transistor stack forms a stack of base-emitter (B-E) transistor junctions establishing a second potential at the emitter follower transistor element base node with reference to ground. The second potential level is clamped at the base node when the transistor elements of the stack are conducting. The second potential level is less than the first potential level and thereby sets up an "overdrive" potential difference at the base node of the input emitter follower transistor element of the stack equal to the difference between the first and second potential levels.

The TTL transistor stack includes at least one TTL switching transistor element with a feedback clamp circuit coupled between the collector node of the switching transistor element and the base node of the emitter follower transistor element. The feedback clamp circuit includes at least one voltage drop element which is preferably a "programmable" or selectable voltage drop element such as a resistor element for establishing a selected operating voltage drop. The clamp circuit conducts overdrive current set up at the base node of the emitter follower transistor element by the overdrive difference voltage. The clamp circuit conducts when the TTL switching transistor element begins conducting and the voltage level at the collector node of the TTL switching transistor element falls to the level of the operating voltage drop of the clamp circuit. This operating voltage drop is selected or "programmed", by, for example, selection of the value of one or more voltage drop resistor elements, to clamp or hold operation of the switching transistor element in the desired operating region. This may be, for example, operation in soft saturation, threshold saturation, or out of saturation entirely in the linear operating region.

The feedback clamp circuit forms a feedback loop between the input emitter follower transistor element and the TTL switching transistor element which may be, for example, a phase splitter transistor element or a pulldown transistor element. The clamp circuit forms the second branch of the feedback loop while the stacked B-E junctions from the base node of the emitter follower transistor element to the emitter node of the switching transistor element forms the first branch. The voltage drop across the second branch is greater than the voltage drop across the first branch by the amount of the operating voltage difference which clamps the B-C junction voltage $V_{BC}$ of the switching transistor element for operation in the desired operating region.

A feature of the emitter follower transistor element at the input to the transistor stack is that it provides amplification of base drive current to the stack. The base current required by the emitter follower transistor element follower transistor element from the level shift current mirror current source is therefore negligible. The overdrive current set up at the base node of the emitter follower transistor element by the overdrive potential difference can therefore be assumed to flow through the clamp circuit branch of the feedback loop for purposes of the foregoing analysis.

Other objects, features and advantages of the invention are apparent in the following specification and accompanying drawings.

BRIEF DESCRIPTION OF THE DRAWINGS

FIG. 1A is a graph of the delayed ramp switching function during discharge and transition from logic high to low voltage level at the base of the phase splitter transistor element of FIG. 1.

FIG. 2A is a graph of the accelerated switching function during transition from logic high to low voltage levels at the base of the phase splitter transistor element of FIG. 2.

FIG. 3 is a fragmentary schematic circuit diagram of a portion of the translator circuit showing an alternative circuit configuration for the emitter follower output buffer circuit for limiting base drive to the phase splitter transistor element of the TTL gate.

DESCRIPTION OF PREFERRED EXAMPLE EMBODIMENTS AND BEST MODE OF THE INVENTION

Figure 1:
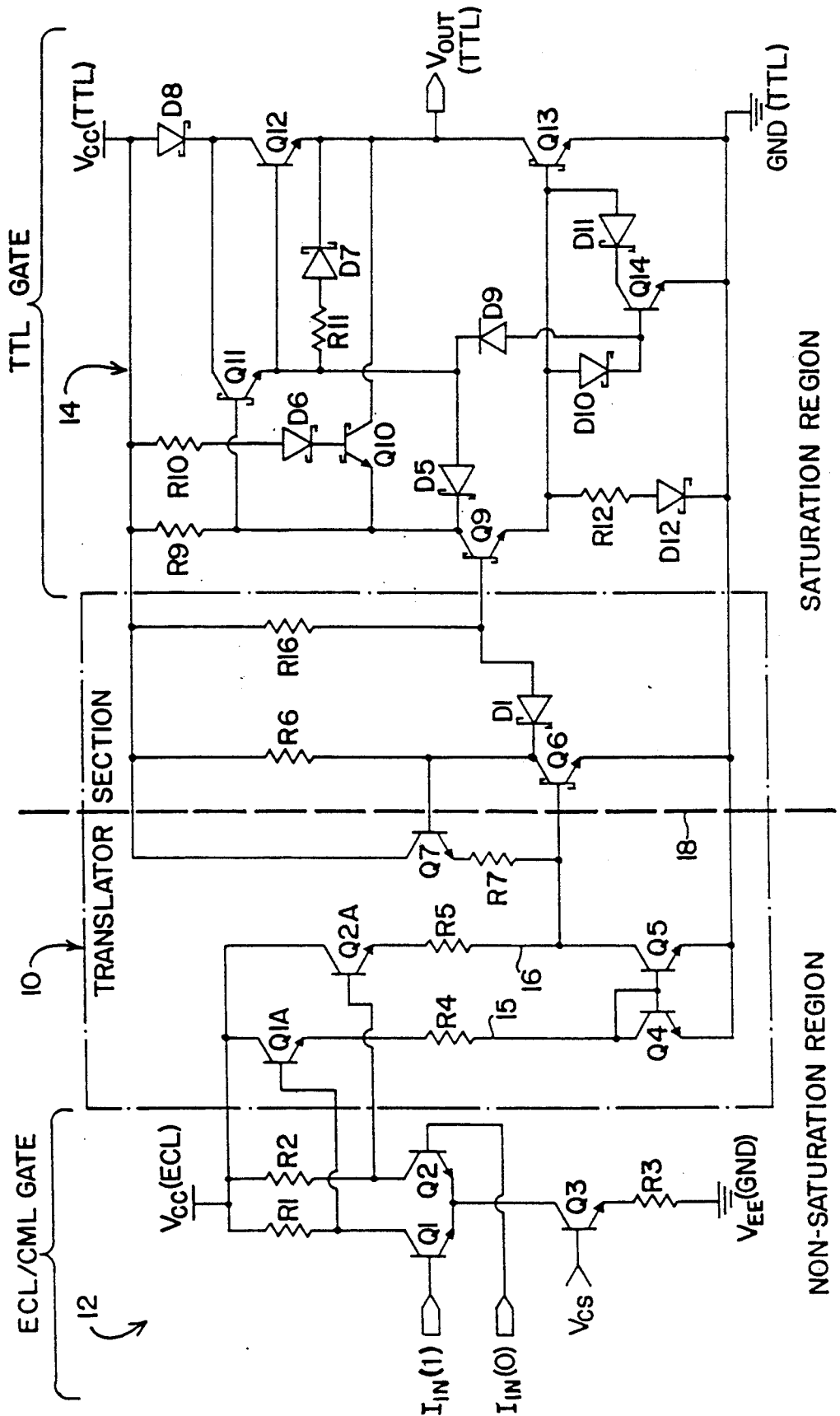
FIG. 1 is a schematic circuit diagram of a prior art ECL/CML to TTL translator circuit coupling the output of an ECL gate to the input of a TTL gate.
Figure 2:
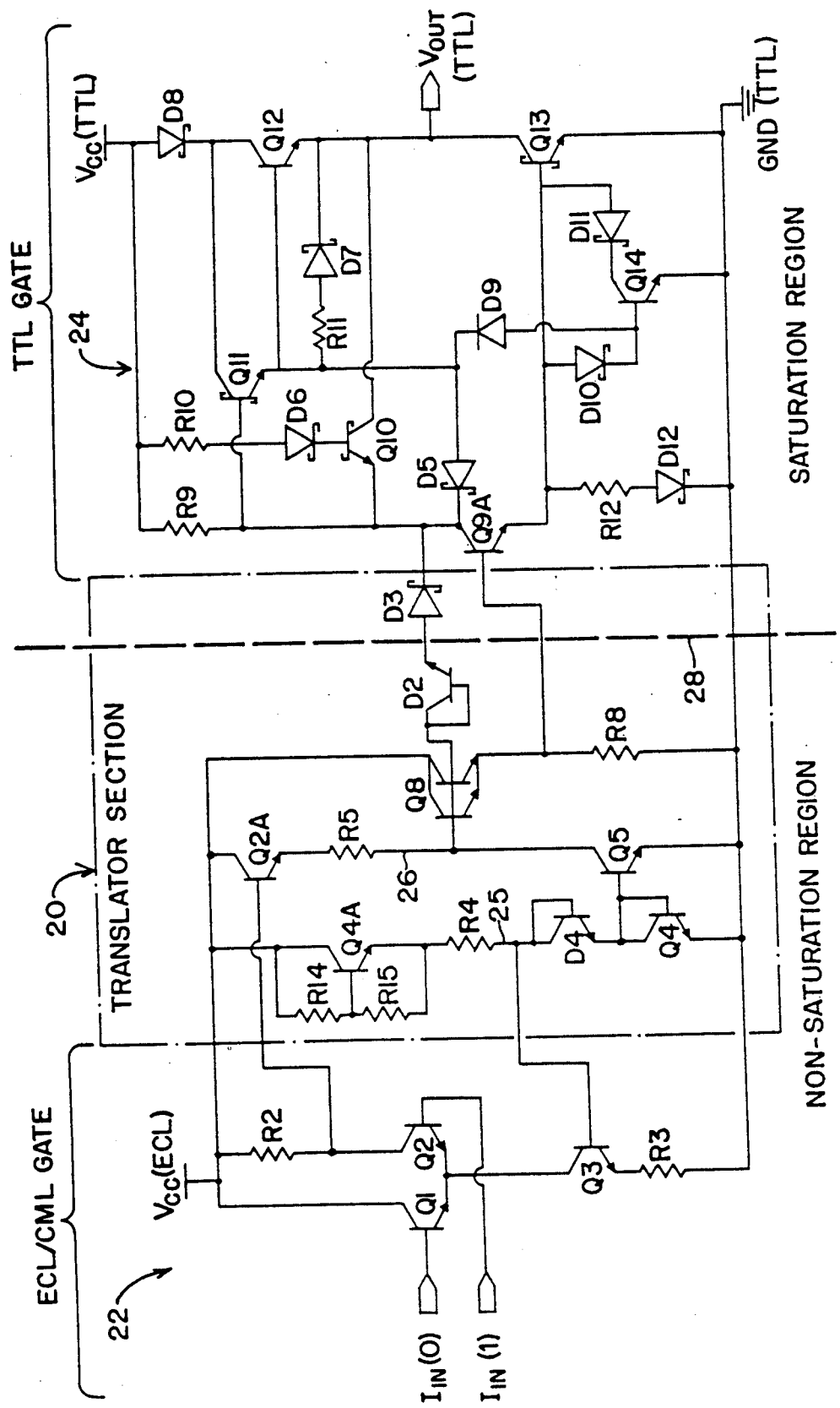
FIG. 2 is a schematic circuit diagram of an ECL/CML to TTL translator circuit coupling the output of an ECL gate to the input of a TTL gate according to the invention.

A translator circuit 20 according to the present invention is illustrated in FIG. 2 coupled between the conventional ECL gate 22 and TTL gate 24. Circuit components performing circuit functions comparable to the circuit components of FIG. 1 are indicated by the same reference designations. The first primary difference between the translator circuit 20 of FIG. 2 and the prior art translator circuit 10 of FIG. 1 is in the current mirror circuit provided by current mirror branch circuits 25 and 26 of FIG. 2. According to the invention, the current mirror branch circuit 25 is coupled between the higher voltage level ECL rail $V_{CC}$(ECL) and the lower voltage level or ground potential TTL rail GND (TTL) without any direct connection to the output of the ECL gate taken from the collector node of either of the ECL input transistors Q1 and Q2.

Resistor R4 in current mirror branch circuit 25 establishes a constant current or reference current in the branch circuit 25 according to the voltage drop across resistor R4. The voltage drop across resistor R4 is dependent upon the voltage level of the ECL voltage rail $V_{CC}$ and the respective voltage drops across resistor R14, $V_{BE}$ across transistor element Q4A and the two $V_{BE}$'s across the diode stack provided by base collector shorted (BCS) transistors D4 and Q4. Resistor R15 provides a bias resistor for transistor element Q4A. Transistor element Q4 provides the first current mirror transistor element in branch circuit 25. Transistor Q5 provides the second current mirror transistor element in the branch circuit 26 and is coupled in current mirror configuration with the first current mirror transistor element Q4.

The second current mirror branch circuit 26 is coupled to the output of the ECL gate at the collector node of ECL input transistor Q2 through emitter follower buffer transistor element Q2A and resistor R5. The second current mirror transistor element Q5 relays or mirrors the constant reference current from branch circuit 25 into the current mirror branch circuit 26. The constant reference current established in current mirror branch circuit 25 remains constant during switching of the ECL gate, maintaining the constant reference current between the higher level ECL reference voltage rail $V_{CC}$ and the lower level TTL reference voltage rail GND. This constant reference current is similarly mirrored and maintained in the second current mirror branch circuit 26 during switching of the ECL gate and as a result there is no switching of the second current mirror transistor element Q5.

The reference voltage level at the collector node of transistor element Q5 is shifted by resistor R5. The dependency of the voltage drop across resistor R5 on $V_{CC}$ is cancelled by the $V_{CC}$ dependency of the reference current mirrored in the second branch circuit 26. As a result of the offset and cancellation of the $V_{CC}$ dependencies in the second branch circuit 26, analysis shows that the voltage at the collector node of the second current mirror transistor element Q5 is referenced to the lower TTL voltage GND. This is accomplished however without switching of the current mirror transistor elements and without the resulting delay in signal propagation from the ECL gate to the TTL gate. The reference voltage level shifted output at the collector node of transistor Q5 switches between high and low voltage levels at a constant current during switching of the ECL gate input transistor Q2.

The reference voltage level shifted high and low logic voltage level output signals at the collector node of the second current mirror transistor element Q5 in the second current mirror branch circuit 26 are coupled to the base of an emitter follower output buffer circuit including emitter follower output buffer transistor element Q8 shown as a double transistor element. The emitter current from emitter follower output buffer transistor element Q8 drives the base of the phase splitter transistor element Q9A of TTL gate 24. Phase splitter transistor element Q9A is shown as a standard transistor element without internal Schottky clamping. Unlimited base drive from emitter follower transistor element Q8 could otherwise drive transistor Q9A into the deep saturation operating region. An external base drive clamp circuit or base to collector junction (B-C) clamp circuit is provided by diodes D2 and D3 coupled between the collector node of phase splitter transistor Q9A and the base node of emitter follower output buffer transistor element Q8. Diode D2 is a BCS transistor while diode D3 is a Schottky clamp diode providing in effect an external substitute for the internal Schottky diode clamping of phase splitter transistor element Q9 of FIG. 1.

With a logic low level signal at the TTL gate output $V_{OUT}$ and with phase splitter transistor element Q9A and pulldown transistor element Q13 conducting, the starting voltage level at the base of phase splitter transistor element Q9A is 2 $V_{BE}$ above the TTL ground GND. A logic high level signal at the translator circuit output at the collector node of the second current mirror transistor element Q5 maintains this condition with emitter follower output buffer transistor element Q8 conducting and supplying base drive current to the base of phase splitter transistor element Q9A.

Upon switching of the ECL gate and appearance of a logic low voltage level signal at the collector node of current mirror transistor element Q5, emitter follower output buffer transistor element Q8 temporarily turns off and is nonconducting. Discharge current from the base of phase splitter transistor element Q9A is discharged through pulldown resistor element R8 instead of through the second current mirror transistor element Q5. The resistor pulldown of the base of phase splitter transistor element Q9A provides accelerated discharge and accelerated decrease of the voltage level $V_B$Q9A as illustrated in the accelerated pulldown switching function of FIG. 2A. This accelerated discharge and turnoff of the phase splitter transistor element Q9A cannot be achieved by the current source transistor element discharge of the prior circuit of FIG. 1 in which the voltage transition follows the delayed ramp function of FIG. 1A as heretofore described.

Once the voltage at the base of phase splitter transistor element Q9A ($V_B$ Q9A) decreases from 2 $V_{BE}$ to approximately 1 $V_{BE}$, emitter follower output buffer transistor element Q8 can conduct at a reduced level through pulldown resistor R8. While phase splitter transistor element Q9A remains nonconducting, the emitter follower output buffer transistor element Q8 is ready for rapid and accelerated turn on of the phase splitter transistor element upon transition from logic low to logic high voltage level at the collector node of current mirror transistor element Q5.

The temporary turn off of emitter follower transistor element Q8 combines with the resistive pulldown and discharge of the base of the phase splitter transistor element Q9A to provide an accelerated turn off of phase splitter transistor element Q9A not available in the prior art translator circuit. This occurs upon transition from logic high to low voltage level at the output of the translator section 20 located at the collector node of the second current mirror transistor element Q5. However this is followed by return of emitter follower transistor element Q8 to conduction at a reduced or subdued level ready for accelerated turn on.

Transition from logic low to logic high voltage level at the collector node of the second current mirror transistor element Q5 results in full conduction of emitter follower transistor element Q8 with initially unlimited emitter current for the base drive turning on the phase splitter transistor element Q9A. The initially unlimited base drive current provides overdrive for phase splitter transistor element Q9A for fast switching and accelerated turn on of the phase splitter transistor element. This overdrive helps reduce signal propagation time tpHL during transition from high to low potential at the output.

As soon as phase splitter transistor element Q9A becomes conducting however the drop in voltage at the collector node of the phase splitter transistor element Q9A is fed back through the base drive limiting clamp circuit provided by diodes D2 and D3 limiting the base drive of emitter follower transistor element Q8. This base drive limiting feedback clamp prevents phase splitter transistor element Q9A from operating in the deep saturation operating region. It clamps operation of the phase splitter transistor element in the soft saturation operating region or at the threshold of saturation, for example with a base to collector forward bias held in the range 0.2 to 0.7 volts and preferably approximately 0.4 to 0.5 v. The anti-saturation clamp speeds turn off and reduces signal propagation time tpLH during transition from low to high potential at the output. The overdrive and clamp control circuit also reduces and minimizes skew, hysteresis or differential between the signal propagation times tpLH and tpHL for inverting output buffers.

The emitter follower output buffer circuit in combination with the reference voltage level shift provided by the current mirror circuit, and the overdrive and clamp control circuit according to the invention, therefore assists in both accelerated turn off and accelerated turn on of the phase splitter transistor element of the TTL gate. The circuits also tend to equalize the signal propagation times tpLH and tpHL. Moreover, the functions of operating control of the TTL gate input transistor element, in this example phase splitter transistor element Q9A, for operating in the saturation operating region or in the threshold saturation operating region are separated from the function of reference voltage level shifting. The circuit components of the current mirror branch circuits 25 and 26 perform a reference voltage level shifting function only. In particular, the second current mirror transistor element Q5 operates solely to perform the function of reference voltage level shifting across resistor R5 to provide the reference voltage level shifted output signal at the collector node of transistor Q5.

The function of operating region translating from the non-saturation operating region of the emitter coupled logic transistor elements to the soft saturation operating region of the TTL transistor elements or threshold saturation, is accomplished by the emitter follower output buffer circuit. Emitter follower transistor element Q8 itself operates in the linear non-saturation operating region. The emitter follower output buffer circuit includes the pulldown resistor element R8. In combination these components Q8 and R8 assist the accelerated turn on and accelerated turn off of the switching TTL input transistor element of the TTL gate 24, namely phase splitter transistor element Q9A. One or more additional TTL input stages may precede the phase splitter transistor element in which case the emitter follower buffer transistor element drives the TTL input transistor element. Preferably, the phase splitter transistor element is directly driven.

As a result logic high and low level signals can propagate through the translator circuit 20 from the ECL gate 22 to the TTL gate 24 without the delays interposed by the switching current mirror current source transistor elements of the prior art translator circuits. Nor are there the delays caused by circuit components performing dual functions of both reference voltage level shifting and operating region translating. The TTL overdrive and clamp control circuit further reduces signal propagation times tpLH and tpHL. By this arrangement the translator circuit of the present invention provides 30% overall improvement in speed in comparison with the translator circuit 10 of FIG. 1. Skew is reduced in signal propagation times tpLH and tpHL for inverting output buffers.

Furthermore, the translator circuit 20 of FIG. 2 eliminates the additional inverting stage transistor element Q6, the first stage transistor element operating in the saturation region. As shown in FIG. 2 by the dash line 28, the emitter follower transistor element Q8 operating in the linear non-saturation region directly drives the phase splitter transistor element Q9A of TTL gate 24 in the soft saturation operating region or in the threshold saturation operating region.. The translator circuit 20 of FIG. 2 also results in significant noise reduction in the $V_{CC}$ and ground GND power rails. As shown in FIG. 2 the power supply $V_{CC}$(ECL) and $V_{CC}$(TTL) can be coupled to the same $V_{CC}$ power rail while the low level voltage rails including $V_{EE}$ and ground GND (TTL) can be coupled to the same ground GND rail.

Another feature of the translator circuit 20 of FIG. 2 is the following. The diode stack provided by D4 and Q4 sets the tail current source voltage level $V_{CS}$ at, for example, 2 $V_{BE}$ above ground for driving the tail current source transistor element Q3. This derivation of the tail current source voltage $V_{CS}$ references $V_{CS}$ to the ECL high potential power rail $V_{CC}$ is that it is isolated from output noise at the output and ground rail.

An alternative embodiment of the emitter follower output buffer circuit of the translator section 20 is illustrated in FIG. 3. According to this embodiment the base drive from emitter follower transistor element Q8 to the base of phase splitter transistor element Q9B is limited by base drive limiting resistor R8A instead of the base drive limiting clamp circuit of FIG. 2 provided by diode elements D2 and D3. As shown in FIG. 3, the feedback clamp between the collector node of phase splitter transistor Q9B and the base node of emitter follower transistor element Q8 has been eliminated. Instead, base resistor R8A has been inserted at the base node of phase splitter transistor element Q9B. In this embodiment, the phase splitter transistor element Q9B is a Schottky transistor provided with an internal Schottky diode clamp between the collector and base nodes to maintain the phase splitter transistor element Q9B in the soft saturation operating region, preventing the transistor from being driven into the hard saturation operating region.

The remaining components of the emitter follower output buffer circuit remain the same as in FIG. 2 including the emitter follower transistor element Q8 and pulldown resistor element R8. The remainder of the translator circuit 20 and in particular the constant current non-switching current mirror circuit as set forth in FIG. 2 also remains the same. By the alternative circuit arrangement of FIG. 3 accelerated turn on of phase splitter transistor element Q9B is still achieved with limitation of the base drive by base resistor R8A and the internal Schottky clamp maintaining the phase splitter transistor element Q9B in the soft saturation operating region. Accelerated turn off of phase splitter transistor Q9B is achieved by the resistive pulldown through pulldown resistor element R8 as heretofore described. A typical value for the phase splitter base resistor R8A is, for example, 1K ohms.

Figure 4:
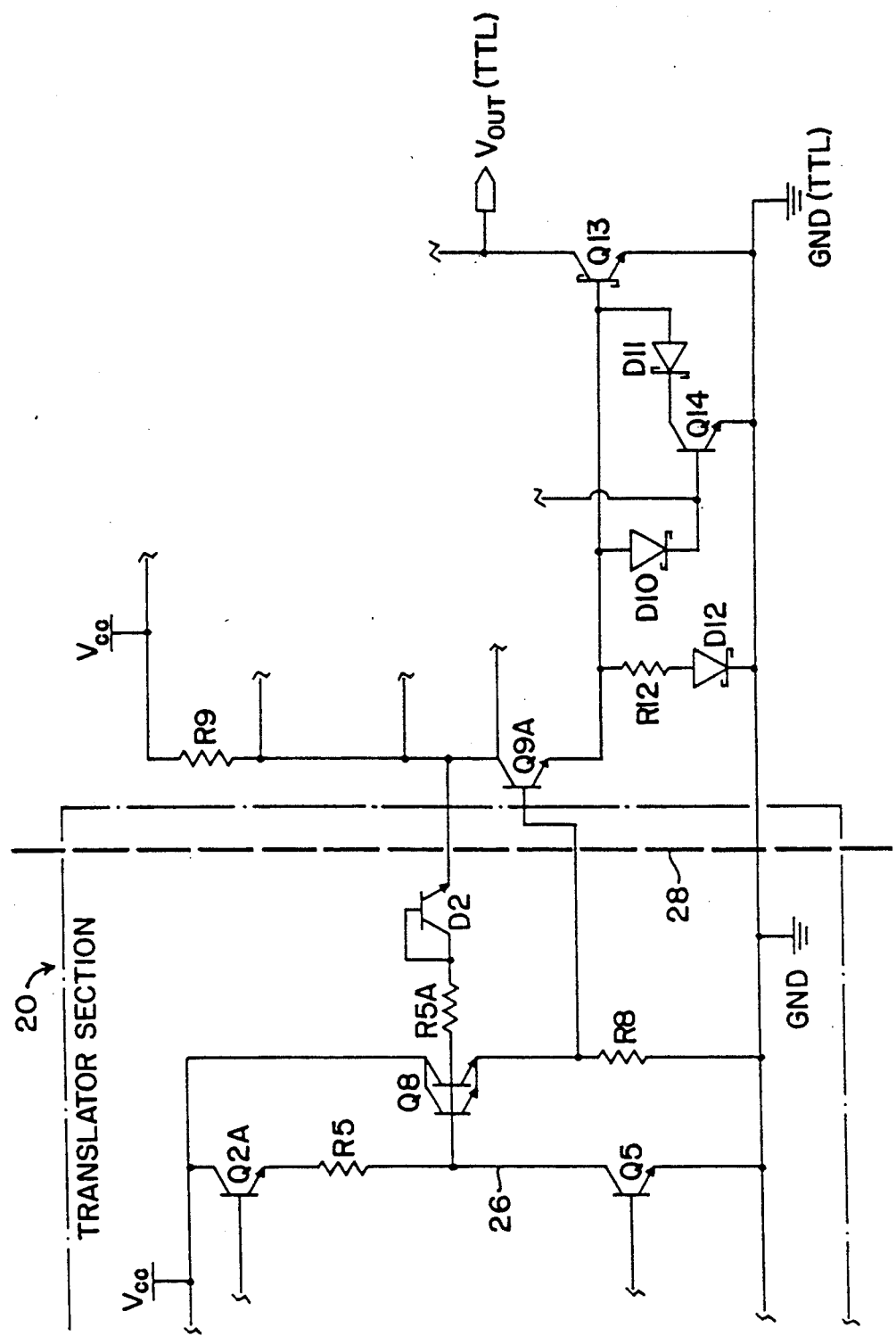
FIG. 4 is a fragmentary schematic circuit diagram showing a preferred "programmable" base drive clamping circuit for the overdrive and clamp control circuit coupled to the phase splitter transistor element or other switching TTL input transistor element.

A preferred arrangement for the base drive clamp circuit between the collector node of phase splitter transistor element Q9A and emitter follower output buffer transistor element Q8 is illustrated in the schematic circuit diagram excerpts of the ECL to TTL translator shown in FIG. 4. As shown in FIG. 4, the preferred base drive limiting clamp circuit is provided by resistor R5A and BCS diode D2. In this example the resistor R5A and diode D2 coupled between the collector node of phase splitter transistor Q9A and emitter follower transistor element Q8 replace the Baker clamp of FIG. 2 consisting of BCS diode D2 and Schottky diode D3. It is noted that the BCS diode D2 provides a diode potential drop of 1 $V_{be}$ which is also designated 1$\phi$. The potential drop of 1 $V_{be}$ or 1$\phi$ at room temperature is approximately 0.8 v. The resistance of resistor R5A is selected to provide a potential drop of approximately $\frac{1}{2}$ $V_{be}$ or $\frac{1}{2}\phi$.

The forward bias across the base to collector junction of the phase splitter transistor element Q9A provided by the base drive limiting clamp circuit components R5A and D2 when Q9A is conducting, is as follows. The potential drop of 1 $V_{be}$ across BCS diode D2 is cancelled or offset by the 1 $V_{be}$ potential drop across the base to emitter junction of emitter follower transistor Q8. As a result the forward bias across the base to collector junction of phase splitter transistor element Q9A when transistor element Q9A is conducting is approximately equal to the potential drop across resistor R5A, that is a potential drop of $\frac{1}{2}$ $V_{BE}$ or 0.5$\phi$. The operation of the phase splitter transistor element Q9A is therefore clamped in the so called soft saturation operating region or in the threshold saturation operating region. For a standard TTL switching transistor element the soft saturation operating region may be defined, for example as the base to collector forward biasing voltage range of approximately 0.4 to 0.8 volts ($\frac{1}{2}\phi < V_{BC} \leq \phi$) and preferably according to the invention in the range of 0.4 to 0.5 volts. As used herein, the threshold saturation operating region implies even lower forward bias $V_{BC}$ in the range of approximately 0 to 0.4 volts ($0 \leq V_{BC} < \frac{1}{2}\phi$).

The advantage of resistor R5A is that it provides a "programmable" base drive limiting or base-collector junction bias limiting clamp for the overdrive and clamp control circuit according to the resistance value and voltage drop selected for resistor R5A. Thus, the resistor value of component R5A may be selected for operation of the TTL switching transistor element in the soft saturation operating region, in the threshold saturation operating region, or entirely out of saturation and in the linear operating region. The external "programmable" overdrive and clamp control circuit thus provides the capability for a new class of linear TTL circuits.

More generally as shown in FIG. 4 the invention provides a new overdrive and anti-saturation clamp circuit for high speed switching operation of a phase splitter transistor element or other TTL input switching transistor element. The overdrive and anti-saturation clamp circuit includes a voltage reference current source provided by a level shift circuit such as the current mirror circuit and in particular the current branch circuit 26. An emitter follower buffer transistor element Q8 delivers the current for driving the phase splitter transistor Q9A or other TTL input switching transistor element. The emitter follower buffer transistor element Q8 initially provides active and unlimited base drive or "overdrive" for fast turn on of the transistor element Q9A.

The overdrive and anti-saturation clamp circuit also includes the base drive limiting clamp circuit provided in the example of FIG. 4 by the resistor R5A and BCS diode junction element D2 coupled in series. The resistance value of resistor R5A is selected to provide the desired forward bias voltage across the base to collector junction of transistor element Q9A to clamp operation of the transistor element in the soft saturation operating region, in the threshold saturation operating region, or entirely out of saturation in the linear operating region. This anti-saturation clamping action by the base drive limiting clamp circuit assures rapid turn off of transistor element Q9A during active switching.

An additional feature of the external overdrive and anti-saturation clamp circuit for application in TTL output buffers generally is that the turn on of phase splitter transistor element Q9A or other TTL input switching transistor element is graduated. The collector to emitter current through transistor element Q9A upon transition from low to high potential at the base node of transistor element Q9A is initially provided by the collector path current through collector path resistor R9. This collector current is then enhanced for example after 1.5 ns by the base drive limiting clamp circuit current through resistor R5A and diode D2. The clamp circuit current may be in the order of $\frac{1}{3}$ the collector path current providing a graduated increase in the current sinking to the ground rail. As a result the change in current di/dt across the parasitic inductance L of the ground rail is reduced and the ground bounce potential Ldi/dt inhibited.

Furthermore in the context of the TTL output gate, phase splitter transistor element Q9A drives pulldown transistor element Q13. Upon transition from high to low potential at the TTL gate output $V_{out}$, transistor elements Q8, Q9A and Q13 are all conducting. A current path is therefore established between the voltage reference current source in current mirror branch circuit 26 and the TTL gate output $V_{out}$ through emitter follower transistor Q8, phase splitter transistor element Q9A, and the internal Schottky diode clamp of the Schottky transistor element Q13. Upon the occurrence of negative ground undershoot, emitter follower transistor element Q8 responds momentarily delivering a ground undershoot counteracting current. As a result parasitic ground undershoot current change −di/dt is cancelled or offset by the emitter follower sourced counteracting current change di/dt.

Figure 5:
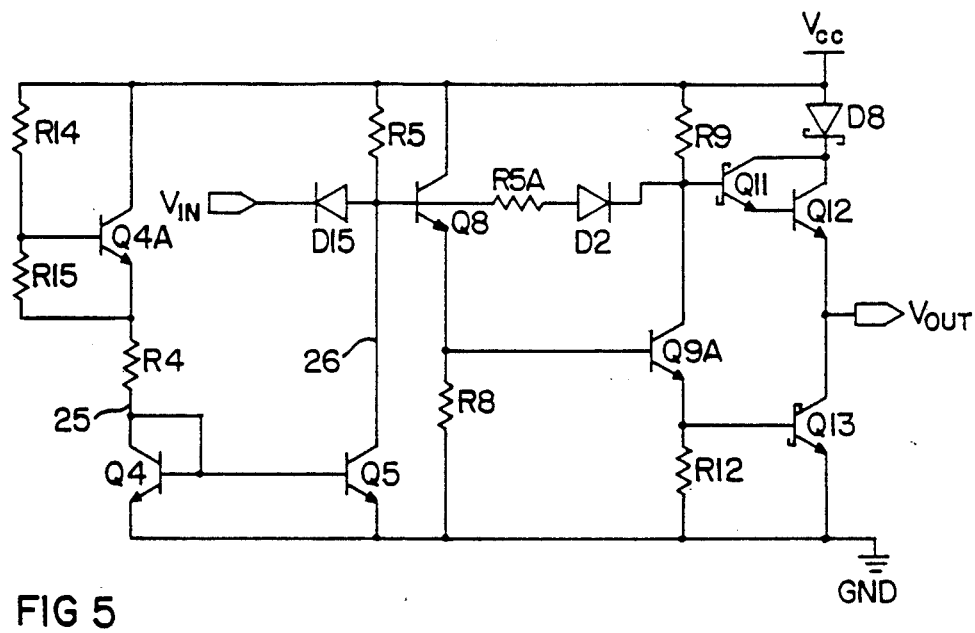
FIG. 5 is a schematic circuit diagram of a generalized and simplified TTL inverting output gate with the phase splitter transistor in an external overdrive and clamp control circuit which precludes saturation and minority carrier storage.
Figure 6:
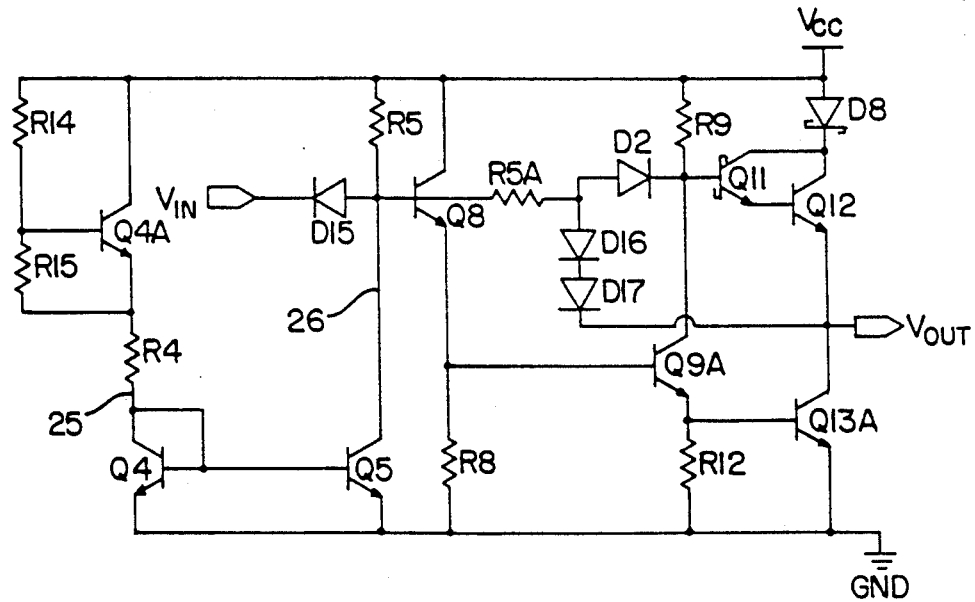
FIG. 6 is a schematic circuit diagram of a generalized and simplified TTL inverting output gate in which both the phase splitter and pulldown transistor elements are coupled in the external overdrive and clamp control circuit that precludes saturation of the respective TTL switching transistor elements and avoids minority charge carrier storage.
Figure 7:
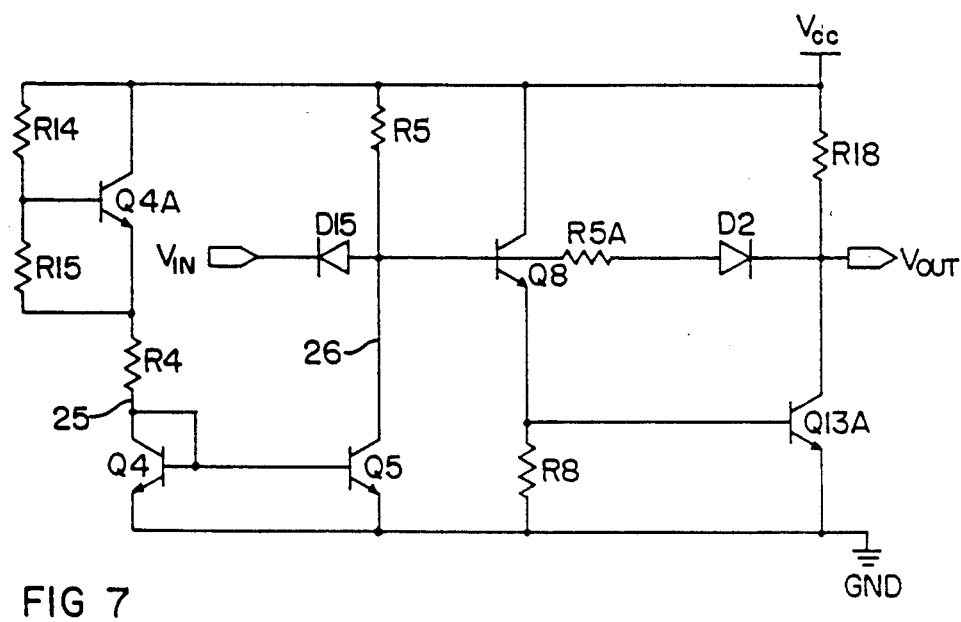
FIG. 7 is a schematic circuit diagram of a generalized TTL internal, low-drive, inverting gate in which the pulldown transistor is coupled in an external overdrive and clamp control circuit to preclude saturation and minority charge carrier storage.

It is apparent that the overdrive and anti-saturation clamp control circuit may have broad application for high speed switching and control of TTL switching transistor elements and TTL gates generally as illustrated in the examples of FIG. 5–7.

Figure 5A:
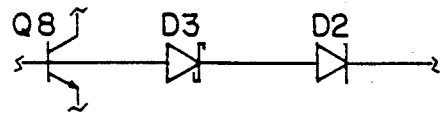
FIG. 5a shows an alternative feedback clamp for the overdrive and clamp control circuit using a Schottky barrier diode in place of the resistor of FIG. 5.

A generalized TTL output gate or buffer incorporating the overdrive and clamp control circuit is illustrated in FIGS. 5 and 5A. This TTL output invertor gate may be used generally beyond the particular application for ECL/CML to TTL translator circuits to TTL circuits generally. Circuit components performing the same function as components shown in FIGS. 2 and 4 are indicated by the same reference numerals or designations. The description of the applicable designated circuit components with reference to FIGS. 2 and 4 is applied here to the generalized TTL output gate circuit of FIGS. 5 and 5A. In the example of FIGS. 5 and 5A however, the input signal is applied directly from a host circuit through input diode D15 at the collector node of current mirror transistor element Q5 in current mirror branch circuit 26. This current mirror branch circuit provides the necessary level shift reference voltage current source for the overdrive and clamp control circuit provided by emitter follower transistor element Q8 and base drive or B-C junction clamp components R5A and D2 in the example of FIG. 5 and D2 and D3 in the example of FIG. 5A.

It is to be understood that this circuit has been simplified by omitting other circuitry that may typically be present, but is not necessarily related to the invention. For example, the output feedback circuitry is omitted and no Tri-State ® circuits are shown. Also, the well-known AC "Miller Killer" circuit has been omitted along with the commonly used transfer function squaring circuit. Furthermore, a number of commonly used, node capacitance discharge and clamping diodes are not shown. All of these features are, however, well known to engineers skilled in solid state circuit design.

One of the advantages of the circuit is that as the forward bias voltage drop designated $\phi$ across the PN junction diode D2 varies with temperature, the bias on the collector of transistor Q9A will not have to follow the adverse temperature coefficient of a Schottky diode. The $0.5\phi$ bias is self-compensating over the desired temperature range. In the case of a Schottky clamped transistor the diode forward potential drop does not maintain the desired bias at higher temperatures. At the higher operating temperatures the prior art circuits show increasing delay in the low-to-high output transition as transistor saturation slows the turn off of the output sink current. The circuits of FIGS. 5 and 5A avoid this characteristic and the low-to-high transition remains constant with temperature.

It is understood that while resistor R5A is preferred and this configuration represents the preferred embodiment of the invention, the resistor can be replaced by a Schottky diode as shown in FIG. 5A. With a Schottky diode coupled in the feedback clamp circuit as shown in FIG. 5A, phase splitter transistor element Q9A becomes a Schottky clamped transistor element but with an external Schottky clamp rather than an internal Schottky clamp, operating in the soft saturation operating region.

The FIG. 5 circuit represents an inverting gate that has a large fan-out characteristic and is the circuit preferred for logic output gates and common bus driving applications, the circuit of FIG. 6 is an inverting gate intended for IC chip internal drive applications. It illustrates a further application of the invention in which both the phase splitter transistor element Q9A and the pulldown transistor element Q13A are coupled in an external overdrive and clamp control circuit. Where the parts function in the same way as those of FIG. 5, the same reference numerals and designations are employed. The main difference is the use of a conventional pull-down transistor element Q13A in the output without an internal Schottky diode because an external clamp control circuit is provided as for transistor element Q9A. Thus, both transistors elements Q9A and Q13A avoid saturation without the requirement of an internal Schottky clamp diode.

As in FIG. 5, the voltage drop across resistor R5A is $0.5\phi$ and the collector node of transistor Q9A is clamped at $1.5\phi$ volts below the base node of emitter follower transistor element Q8 and $0.5\phi$ volts below its own base node by resistor R5A and diode D2. The action of diodes D16 and D17, also coupled in series with resistor R5A but in parallel with diode D2, clamps the collector node of transistor Q13A at $2.5\phi$ volts below the base node, of emitter follower transistor element Q8 and $0.5\phi$ volts below its own base node. The Q13A transistor element base node is at $\phi$ volts above ground when on, with its collector node at $0.5\phi$ volts below its base node and any substantial saturation is avoided. Minority charge carrier storage in the base is minimized reducing turn off delay in both transistor elements Q9A and Q13A.

As in FIG. 5, resistor R5A of FIG. 6 can be replaced with a Schottky diode to produce a forward bias voltage drop of close to and only slightly greater than $0.5\phi$ at least in the vicinity of room temperature. In using Schottky diodes in the feedback clamp control circuits, the respective TTL switching transistor elements become "externally" Schottky clamped. As previously described, the external Schottky clamps hold the operation of the respective transistor elements in the soft saturation operating region. With increased temperature, charge carrier storage increases in the base regions because of the absence of temperature compensation as heretofore described, slowing turn off times.

It is noted that the circuits of FIGS. 5 and 6 also preserve the additional advantages of providing a staged or two step turn on of collector to emitter current through transistors Q9A and Q13A which reduces "ground bounce". The circuit of FIG. 5 also provides a conductive current path from the level shift voltage reference current source provided by the current mirror circuit to the output for cancelling ground undershoot. The ground undershoot suppressing current can pass from $V_{CC}$ through resistor element R5 and the clamp control circuit elements R5A and D2 to the output. Parasitic ground undershoot current change $-di/dt$ may be cancelled at least in part by a counteracting current change $di/dt$ while the clamp circuit is conducting.

The theory of operation and the principles of operation of the TTL buffer current source controlled overdrive and clamp circuit are summarized as follows. An overdrive potential of $\frac{1}{2}\phi$ is set up at the base node of emitter follower transistor element Q8. The level shift current source provided by the current mirror circuit Q4,R4,Q5, R5 etc. establishes the potential of $3.5\phi$ above ground potential at the base node of Q8 as heretofore described. On the other hand, the stack of TTL transistor element $V_{BE}$'s provided by the emitter follower transistor element Q8, phase splitter transistor element Q9A, and pulldown transistor element Q13 when conducting, clamps the base node of Q8 at $3\phi$ potential. The difference of $\frac{1}{2}\phi$ constitutes the overdrive potential.

The importance of the emitter follower active transistor element Q8 in the TTL transistor stack of the TTL gate is that it constitutes a "β amplifying active element". The emitter follower Q8 as the first transistor element of the stack delivers base drive current with a factor of β amplification from the level shift current source while at the same time forming a buffer between the TTL gate and the level shift current source. As a result of the β amplification of base drive current from the emitter of Q8, the base current into the emitter follower transistor element is relatively small and therefore negligible. It can be assumed that the feedback clamp circuit absorbs the extra "overdrive" current that appears at the base node of the emitter follower Q8 because of the overdrive potential of $\frac{1}{2}\phi$ set up at the base node of Q8 by the difference between the level shift current source potential and the stack clamp potential.

This extra current set up in the clamp circuit passes through clamp circuit resistor element R5A. The value of clamp circuit resistor R5A is selected in this example to be the same value as resistor R5 in the level shift circuit so that the voltage drop across R5A is $\frac{1}{2}\phi$. Thus, the ratio of R5/R5A should be 1 so that the voltage drop across R5A is $\frac{1}{2}\phi$. With a drop of 1 $V_{BE}$ or 1$\phi$ across PN junction diode D2, the phase splitter transistor element Q9A is clamped for operation with a forward B-C junction bias $V_{BC}$ of $\frac{1}{2}\phi$ or approximately 0.4 volts between threshold saturation and soft saturation. The value of resistor R5A can be selected or "programmed" however to clamp operation at the desired operating point. And, the voltage drop can vary over resistor R5A to control and pass excess or "overdrive" current.

FIG. 7 shows the application of the invention to a low drive inverting gate of the kind employed for internal drive circuit applications on an IC chip. Here, the output pulldown transistor element is transistor Q13A while resistor R18 acts as the pull-up element. Emitter follower transistor element Q8 drives the base of transistor element Q13A with resistor R8 acting as its load element. Diode D15 couples the base of transistor element Q8 to input terminal $V_{IN}$. Transistor element Q5 mirrors the current in transistor element Q4 and transistors Q4 and Q5 are matched so that the same emitter current flowing in transistor element Q4 must also flow through transistor element Q5.

Transistor element Q4A produces a $\phi$ voltage drop across resistor R15. Resistor R14, for the circuit shown, is made equal to one and a half times the value of resistor R15 so that 1.5$\phi$ appears across transistor Q4A. The potential across resistor R4 is therefore $V_{CC}-2.5\phi$. If resistors R5 and R4 are matched, the upper clamp value for the base of transistor Q8 is 2.5$\phi$. Since transistors Q8 and Q13A, when on, clamp the base of transistor Q8 at 2$\phi$, the feedback clamp will have to conduct sufficient current to drop the additional 0.5$\phi$ volts across resistor R5.

Diode D2 acts with resistor R5A to provide the feedback clamp circuit. Resistor R5A matches resistors R5 and R4 so that the external clamp circuit establishes the potential at the output terminal $V_{OUT}$ at approximately 0.5$\phi$. Since the base of pulldown transistor element Q13A is at $\phi$, Q13A will also be clamped for operation in the threshold saturation operating region when conducting. This circuit is very fast because it's transistor elements Q8 and Q13A effectively do not saturate.

Schottky clamped transistors are not required for the output pulldown function.

As in FIGS. 5 and 6, the clamp circuit of FIG. 5A can be used. In that event, resistor R5A is replaced by a Schottky diode D3. However, this modification does not provide the benefit of high temperature compensation and tracking of the saturation threshold region by the feedback clamp circuit.

In all of the circuits illustrated in FIGS. 5-7 incorporating the new overdrive and anti-saturation clamp control circuit, an additional advantage is the reduced power requirements for operating the TTL gate circuits. Power requirements are reduced in two respects. First, base drive requirements for the transistor stack of TTL switching transistor elements are reduced by a factor approaching the amplification of base current provided by switching transistor elements operating in the linear region. Base drive current for a transistor operating in saturation is approximately 1/5-1/10 of the collector current while base drive current for operation in the linear region is only 1/50-1/400 of the collector current, a factor of 10 to 40 times smaller. Second, in the case of undesirable charge storage in the base region of a transistor operating in the saturation region, more base drive current is required to drain stored charge while supporting the desired collector current.

It is noted that in each of the illustrated embodiments of the invention a conventional PN junction diode is connected to the collector of a conventional NPN junction transistor. It is preferred that the IC chip be fabricated so that the diode is directly associated with the transistor. When using the Isoplanar II process the diode can be oxide isolated from the transistor, but the diode and transistor can be formed to share a common conductive buried layer. The diode is formed simultaneously with transistor bases so that a P type diffused anode layer is formed within an N type epitaxial layer. The shared N++ buried layer forms the common terminal for the transistor collector and the diode cathode.

While the invention has been described with reference to particular example embodiments it is intended to cover all modifications and equivalents within the scope of the following claims.

I claim:

1. An overdrive and clamp circuit for high speed switching of a TTL switching transistor element comprising:
   a reference voltage current source;
   an emitter follower transistor element having a base node coupled to the reference voltage current source, said emitter follower transistor element being coupled to drive the TTL switching transistor element;
   said reference voltage current source having a reference voltage level at the base node of the emitter follower transistor element for providing base drive to the TTL switching transistor element for accelerated turn on of the TTL switching transistor element;
   and a base drive clamp circuit coupled between a collector node of the TTL switching transistor element and a base node of the emitter follower transistor element for clamping operation of the TTL switching transistor element out of the deep saturation operating region said base drive clamp circuit comprising a resistor element and a PN diode junction element coupled in series, said resistor element in series with the PN diode junction element providing a programmable clamp voltage according to the selected resistance of the resistor element for clamping operation of the TTL transistor element in a desired operating range.

2. The overdrive and clamp circuit of claim 1 wherein the TTL switching transistor element comprises a phase splitter transistor element in a TTL output buffer circuit having a Schottky pulldown transistor element coupled to the output of the TTL output buffer circuit, said phase splitter transistor element having an emitter node coupled to drive the base node of the pulldown transistor element, whereby the reference voltage current source, emitter follower transistor element, phase splitter transistor element and pulldown transistor element source a counter-acting current for canceling ground undershoot at the output of the TTL output buffer circuit during transition from high to low potential at said output.

3. The overdrive and clamp circuit of claim 1 wherein the reference voltage current source comprises a current mirror circuit.

4. The overdrive and clamp circuit of claim 1 further comprising a resistor pulldown element coupled between a base node of the TTL switching transistor element and ground potential.

5. A TTL logic gate circuit including a switching transistor element coupled to receive logic input signals and operating to provide logic output signals, said circuit comprising:
   an emitter follower transistor element having a base node coupled to receive said logic input signals and an emitter node coupled to drive said switching transistor element;
   a reference voltage current source coupled to said emitter follower transistor element base node and having a reference voltage level at said base node for providing base drive to said switching transistor element for accelerated turn on of the switching transistor element; and
   a base drive clamp circuit coupled between the collector node of said switching transistor element and the base node of said emitter follower transistor element said clamp circuit comprising the series combination of a resistor and a diode whereby the clamp voltage of the base drive clamp circuit is programmable according to the selected resistance value of said resistor.

6. The TTL logic gate circuit of claim 5 wherein said reference voltage current source comprises a current mirror circuit.

7. The TTL logic gate circuit of claim 5 further comprising a pull down resistor coupled between the base node of the switching transistor element and ground whereby the base node of said switching transistor element and the emitter node of said emitter follower transistor element can be rapidly discharged.

8. The TTL logic gate circuit of claim 5 wherein said switching transistor element comprises an output pulldown transistor element of said TTL logic gate.

9. The TTL logic gate circuit of claim 5 wherein said switching transistor element comprises a phase splitter transistor element.

10. The TTL logic gate circuit of claim 9 further comprising an output pulldown transistor element and a second clamp circuit connected between the collector node of said pulldown transistor element and the base node of said emitter follower transistor element for clamping operation of said pulldown transistor element out of the deep saturation operating region.

11. A TTL buffer circuit comprising:
    a TTL transistor stack with an input emitter follower transistor element and an output pulldown transistor element;
    a reference voltage current source coupled to the base node of the emitter follower transistor element, said reference voltage current source establishing a first potential level at the base node with reference to ground potential;
    said transistor stack comprising a stack of base-emitter transistor junctions establishing a second potential level with reference to ground potential at the base node of the emitter follower transistor element when the transistor stack is conducting, said second potential level being less than the first potential level by an overdrive voltage difference to set up an overdrive potential at the base node of the emitter follower transistor element;
    said transistor stack comprising at least one switching transistor element with a feedback clamp circuit coupled between the collector node of the switching transistor element and the base node of the emitter follower transistor element, said feedback clamp circuit establishing a feedback loop between the switching transistor element and the emitter follower transistor element;
    said feedback clamp circuit forming one branch of the feedback loop and comprising at least one voltage drop element establishing a voltage drop between the base node of the emitter follower transistor element and the collector node of the switching transistor element greater than the voltage drop between the base nodes of the emitter follower transistor element and switching transistor element by a clamping voltage difference selected for operation of the switching transistor element in a desired operating region;
    said clamp circuit conducting overdrive current set up at the base node of the emitter follower transistor element when the transistor stack is conducting and the collector node of the switching transistor element drops to the specified clamping voltage difference below its base node for clamping the base-collector junction voltage of the switching transistor element for operation in a desired operating region.

12. The TTL buffer circuit of claim 11 wherein the switching transistor element comprises a phase splitter transistor element.

13. The TTL buffer circuit of claim 11 wherein the switching transistor element comprises said pulldown transistor element.

14. The TTL buffer circuit of claim 12 wherein the clamp circuit comprises at least one diode element and a resistor element coupled in series.

15. The TTL buffer circuit of claim 13 wherein the clamp circuit comprises at least two diode elements and a resistor element coupled in series.

16. The TTL circuit of claim 11 wherein the reference voltage current source comprises a current mirror circuit.

17. The TTL circuit of claim 11 comprising two switching transistor elements including a phase splitter transistor element and said pulldown transistor element.

18. The TTL circuit of claim 17 wherein the clamp circuit comprises two PN junction diode elements and a resistor element coupled in series between the collector node of the pulldown transistor element and base node of the emitter follower transistor element.

19. The TTL circuit of claim 16 wherein the reference voltage current source comprises a constant current, current mirror circuit.

20. A TTL buffer circuit comprising:
A TTL transistor stack with an input emitter follower transistor element and at least one switching transistor element, said transistor stack comprising a stack of base-emitter transistor junctions establishing a first potential level with reference to ground potential at the base node of the emitter follower transistor element when the transistor stack is conducting;
a reference voltage current source coupled to the base node of the emitter follower transistor element, said reference voltage current source establishing a second potential level with reference to ground potential greater than the first potential level at said base node;
and a feedback clamp circuit coupled between the collector node of the switching transistor element and the base node of the emitter follower transistor element, said feedback clamp circuit comprising at least one voltage drop element establishing a clamping voltage for holding operation of the switching transistor element in a desired operating region.

21. The TTL buffer circuit of claim 20 wherein the feedback clamp circuit comprises at least one PN junction diode and a resistor element coupled in series.

22. The TTL buffer circuit of claim 21 wherein the feedback clamp circuit is constructed to clamp operation of the switching transistor element out of deep saturation.

* * * * *